United States Patent
Kaga et al.

(10) Patent No.: US 8,858,865 B2
(45) Date of Patent: Oct. 14, 2014

(54) SILICON NITRIDE SUBSTRATE MANUFACTURING METHOD, SILICON NITRIDE SUBSTRATE, SILICON NITRIDE CIRCUIT SUBSTRATE, AND SEMICONDUCTOR MODULE

(75) Inventors: Youichirou Kaga, Tokyo (JP); Hisayuki Imamura, Tokyo (JP); Junichi Watanabe, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 270 days.

(21) Appl. No.: 13/138,136

(22) PCT Filed: Jan. 13, 2010

(86) PCT No.: PCT/JP2010/000136
§ 371 (c)(1),
(2), (4) Date: Jul. 12, 2011

(87) PCT Pub. No.: WO2010/082478
PCT Pub. Date: Jul. 22, 2010

(65) Prior Publication Data
US 2011/0272187 A1    Nov. 10, 2011

(30) Foreign Application Priority Data
Jan. 13, 2009   (JP) .................................. 2009-004790

(51) Int. Cl.
*B28B 1/00* (2006.01)
*H01L 23/373* (2006.01)
(Continued)

(52) U.S. Cl.
CPC ............ *H05K 1/0306* (2013.01); *H05K 3/0061* (2013.01); *H01L 23/3735* (2013.01);
(Continued)

(58) Field of Classification Search
USPC .......... 174/250, 260–262; 264/683, 5, 12, 60, 264/65, 676; 501/97.2, 97.1, 98.1, 98.2
See application file for complete search history.

(56) References Cited

U.S. PATENT DOCUMENTS 4,814,301 A * 3/1989 Steinmann et al. ............. 501/92
5,720,919 A * 2/1998 Boberski et al. .............. 264/683
(Continued)

FOREIGN PATENT DOCUMENTS

JP    01-203269    8/1989
JP    05-294707    11/1993
(Continued)

OTHER PUBLICATIONS

JP 2008-127226 A (English Translation).*
(Continued)

*Primary Examiner* — Boris Chervinsky
*Assistant Examiner* — Pete Lee
(74) *Attorney, Agent, or Firm* — Paul F. Neils, Esq.; Edwards Neils PLLC

(57) ABSTRACT

A manufacturing method with which a high thermal conductivity silicon nitride substrate having excellent sintering performance can be manufactured without the occurrence of a molding crack or degreasing crack, as well as to provide a silicon nitride substrate, and a silicon nitride circuit board and a semiconductor module using the silicon nitride substrate. In the manufacturing method, in which a slurry is produced by mixing a silicon nitride powder, a sintering additive powder, and a binder in an organic solvent which is a dispersion medium, and the slurry is formed into a sheet, followed by degreasing and sintering, the oxygen content of the silicon nitride powder is 2.0 mass % or less and the specific surface area of the same is 3 to 11 $m^2/g$, the additive ratio of the sintering additive powder is 4 to 15 mol %, and the water content ratio of the organic solvent is 0.03 to 3 mass %.

7 Claims, 1 Drawing Sheet

(51) Int. Cl.
  *H01L 23/15*  (2006.01)
  *C04B 35/584* (2006.01)
  *H05K 1/03*   (2006.01)
  *C04B 35/622* (2006.01)
  *H05K 3/00*   (2006.01)

(52) U.S. Cl.
  CPC ........ H01L 23/15 (2013.01); *H05K 2203/1126* (2013.01); *H05K 2201/0355* (2013.01); C04B 35/584 (2013.01); *H01L 2924/13055* (2013.01); C04B 35/622 (2013.01); *H01L 2924/13091* (2013.01)
  USPC ....................................................... 264/683

(56) References Cited

U.S. PATENT DOCUMENTS

| | | | |
|---|---|---|---|
| 5,804,521 A * | 9/1998 | Takahashi et al. | 501/97.1 |
| 5,928,601 A * | 7/1999 | Miyake et al. | 264/659 |
| 6,391,812 B1 * | 5/2002 | Araki et al. | 501/97.3 |
| 6,410,468 B2 * | 6/2002 | Nakahata et al. | 501/97.1 |
| 7,915,533 B2 * | 3/2011 | Kaga et al. | 174/137 B |
| 2002/0164475 A1 | 11/2002 | Imamura et al. | |
| 2005/0094381 A1 | 5/2005 | Imamura et al. | |

FOREIGN PATENT DOCUMENTS

| | | |
|---|---|---|
| JP | 08-119609 | 5/1996 |
| JP | 2002-029851 | 1/2002 |
| JP | 2002-097005 | 4/2002 |
| JP | 2002-201086 | 7/2002 |
| JP | 2008-127226 | 6/2008 |

OTHER PUBLICATIONS

JP 2002-029851 A English Translation.*
JP 2008-127226 English Translation.*
EP 0636596.*
Extended European Search Report issued in EP 10731148.2 on Jul. 18, 2012.

* cited by examiner

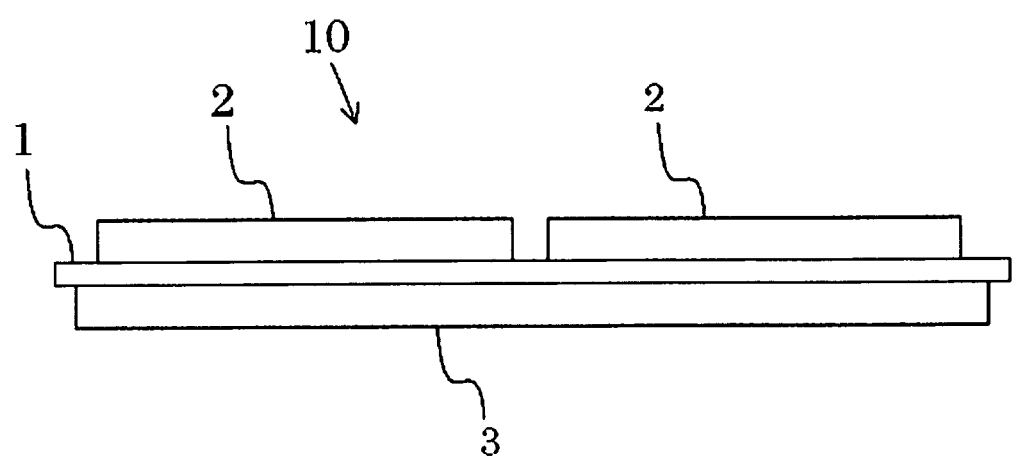

SILICON NITRIDE SUBSTRATE MANUFACTURING METHOD, SILICON NITRIDE SUBSTRATE, SILICON NITRIDE CIRCUIT SUBSTRATE, AND SEMICONDUCTOR MODULE

CROSS-REFERENCE TO RELATED APPLICATIONS

The present invention is a 35 U.S.C. 371 National Stage Entry of PCT/JP2010/000136, filed Jan. 13, 2010, which claims priority from Japanese Patent Application No. 2009-004790, filed on Jan. 13, 2009, the contents of all which are herein incorporated by reference in their entirety.

TECHNICAL FIELD

The present invention relates to a silicon nitride substrate manufacturing method and a silicon nitride substrate. Further, the present invention relates to a silicon nitride circuit board and a semiconductor module using the silicon nitride substrate.

BACKGROUND ART

In recent years, a power semiconductor module (IGBT, power MOSFET, etc.) capable of high-voltage, large-current operation has been used in the field of an electric vehicle inverter. As a substrate used in the power semiconductor module, a ceramic circuit board obtained by bonding a metal circuit plate to one surface of an insulating ceramic substrate and by bonding a metal radiator plate to the other surface thereof can be used. Further, a semiconductor device, etc., is mounted on the upper surface of the metal circuit plate. Methods for bonding the insulating ceramic substrate, metal circuit plate, and metal radiator plate include an active metal method utilizing a brazing filler metal and so-called a direct bonding copper method by which a copper plate is bonded directly.

In such a power semiconductor module, the heat generation increases when large current is made to flow. However, the insulating ceramic substrate is lower in thermal conductivity than a copper plate, which can become a factor for blocking thermal radiation from the semiconductor device. Further, thermal stress based on a difference in thermal expansion coefficient among the insulating ceramic substrate, metal circuit plate, and metal radiator plate occurs, which may make the insulating ceramic substrate cracked and destroyed, or may be a cause of delamination of the metal circuit plate or the metal radiator plate from the insulating ceramic substrate. As described above, high thermal conductivity and high mechanical strength is required for the insulating ceramic substrate to obtain satisfactory thermal radiation performance. Alumina, Aluminum nitride, and silicon nitride can be cited as a material of the insulating ceramic substrate. Among them, silicon nitride can be used as a material for a ceramic substrate having a higher thermal conductivity and excellent in mechanical strength and is thus suitably used for the power semiconductor module having a structure to which strong stress is applied. The silicon nitride substrate has a plate-like shape having a thickness of about 0.1 to 1 mm. As a manufacturing method of the silicon nitride substrate, a method may be adopted in which bulk silicon nitride ceramics is formed into a substrate by a machining process; however, the silicon nitride ceramics is difficult to process, resulting in high cost. Thus, more suitably, a sheet-like formed body is previously produced, followed by sintering to obtain a silicon nitride substrate. As a method for manufacturing the sheet-like formed body, press molding, extrusion molding, and doctor blade molding can be cited. Among them, the doctor blade molding is preferably used because of high mass productivity. However, the doctor blade molding is a molding method in which slurry composed of a ceramic raw material powder, solvent, binder, and the like is made to pass through a slit formed by blades, followed by drying, so that a defect such as crack or wrinkle is easily generated by stress caused due to shrinkage at the drying stage. In order to suppress occurrence of such a defect, the slurry is made to contain a large number of binders for maintaining the binding between raw material powder particles. The larger the specific surface area of the raw material powder used is, the larger number of binders is required for maintaining the binding between the raw material powder particles. However, the binder needs to be burned away in a degreasing process before sintering. Thus, when the amount of the binders to be contained is large, the degreasing may become difficult. The contained amount of the binder is limited for the above reason, so that, in the case where a raw material powder having a comparatively large specific surface area is used, the binder amount does not suffice to cause a defect in the formed body during a drying process at the molding time, which may easily cause a molding crack. In general, in the case of the silicon nitride substrate, a sheet-like formed body having a larger area than the area of a circuit board used as a product is produced, followed by degreasing and sintering, and is finally divided for use, so that it is necessary to extract a product portion from a crack-free area where a molding crack or degreasing crack has not occurred (although the area where the crack has occurred can be subjected to burning). This degrades the production yield, resulting in production cost increase.

Thus, a raw material powder having a comparatively small specific surface area is suitable for manufacturing a defect-free formed body by using the doctor blade method. However, due to comparatively small specific surface area of the raw material powder, sintering performance becomes degraded when the silicon nitride powder hard to be sintered is used, and thus a high density and high thermal conductivity silicon nitride ceramic substrate cannot be obtained.

In order to improve the sintering performance of the silicon nitride ceramics, Patent Document 1 discloses a crystalline silicon nitride powder having a silicon oxide layer as the top layer and a silicon oxynitride layer under the silicon oxide layer, the amount of oxygen existing in the silicon oxide layer being ≤0.1 wt % (expressed in terms of oxygen content) and the amount of oxygen existing in the silicon oxynitride layer being 0.4 to 1.2 wt % (expressed in terms of oxygen content) and having a specific surface area of 5 to 30 m$^2$/g. By using this powder, a silicon nitride formed body easy to sinter and excellent in characteristics of a sintered body such as strength at high temperature can be obtained.

Further, the present inventor has disclosed a silicon nitride powder for developing high mechanical strength performance and high conductive performance and its manufacturing method in Patent Document 2. By using a silicon nitride-based powder having a β fraction of 30 to 100%, an oxygen amount of 0.5 wt % or less, an average particle diameter of 0.2 to 10 μm, and an aspect ratio of 10 or less, it is possible to obtain a high-thermal conduction silicon nitride-based sintered body having excellent mechanical strength and enhanced thermal conductivity more than before without the anisotropy in the direction of thermal conduction.

CITATION LIST

Patent Document

Patent Document 1: Jpn. Pat. Publication No. 08-119609
Patent Document 2: Jpn. Pat. Publication No. 2002-97005

DISCLOSURE OF THE INVENTION

Problems to be Solved by the Invention

However, when the present inventors actually produced a silicon nitride substrate using the silicon nitride powder disclosed in Patent Document 1, the following problem occurred. That is, in the case where a silicon nitride raw material powder having a small specific surface area is used, when the blending ratio of the binder is set such that a molding crack or degreasing crack does not occur, the sintering performance is degraded, making it difficult to obtain a silicon nitride substrate having high density and high thermal conductivity. Thus, a high density and high strength silicon nitride substrate in which a molding crack or degreasing crack does not occur cannot reliably be obtained.

Further, when the present inventors actually produced a silicon nitride substrate using the silicon nitride powder disclosed in Patent Document 2, the following problem occurred. That is, although a silicon nitride substrate having high strength and high thermal conductivity can be obtained, a satisfactory product cannot be obtained in terms of the molding crack or degreasing crack in the case where a silicon nitride raw material powder having a small specific surface area is used.

The present invention has been made in view of the problem inherent in the conventional technique, and an object thereof is to provide a silicon nitride substrate manufacturing method with which a high density and high thermal conductivity silicon nitride substrate having excellent sintering performance can be manufactured without the occurrence of a molding crack or degreasing crack, as well as to provide a silicon nitride substrate, and a silicon nitride circuit board and a semiconductor module using the silicon nitride substrate.

Means for Solving the Problems

As a result of intensive study to solve the above problems, the present inventors have reached the present invention. A silicon nitride substrate manufacturing method is a method in which a slurry is produced by mixing a silicon nitride powder, a sintering additive powder, and a binder in an organic solvent which is a dispersion medium, and the slurry is formed into a sheet, followed by degreasing and sintering. In this method, the oxygen content of the silicon nitride powder is 2.0 mass % or less and the specific surface area of the same is 3 to 11 m$^2$/g, the additive ratio of the sintering additive powder is 4 to 15 mol %, and the water content ratio of the organic solvent is 0.03 to 3 mass %.

A silicon nitride substrate according to the present invention is a silicon nitride substrate manufactured by the above silicon nitride substrate manufacturing method. The silicon nitride substrate contains β-type silicon nitride, at least one rare-earth element (RE), and magnesium (Mg). When the contained magnesium (Mg) and rare-earth element (RE) are converted to magnesium oxide (MgO) and rare-earth element oxide (RE$_2$O$_3$), respectively, the total content of MgO and RE$_2$O$_3$ is 4 to 15 mol %.

A silicon nitride circuit board according to the present invention includes the above silicon nitride substrate, a metal circuit board bonded to one surface of the silicon nitride substrate, and a metal radiator plate bonded to the other surface of the silicon nitride substrate.

A semiconductor module according to the present invention includes the above silicon nitride circuit board and a semiconductor device mounted on the silicon nitride circuit board.

Advantages of the Invention

According to the present invention, there is provided a silicon nitride substrate manufacturing method in which the oxygen content of the silicon nitride powder is set to 2.0 mass % or less and the specific surface area of the same is 3 to 11 m$^2$/g, the additive ratio of the sintering additive powder is set to 4 to 15 mol %, and the water content ratio of the organic solvent is set to 0.03 to 3 mass %. This prevents a molding crack and degreasing crack from occurring, allowing a high density and high conductivity silicon nitride sintered body to be obtained.

In the silicon nitride substrate manufacturing method according to the present invention, the specific surface area of the silicon nitride powder is set to 3 to 11 m$^2$/g. This is because when the specific surface area of the silicon nitride powder exceeds 11 m$^2$/g, the molding crack and/or degreasing crack becomes easy to occur, and when the specific surface area is less than 3 m$^2$/g, the sintering performance is degraded to make it difficult to obtain a high density and high thermal conductivity silicon nitride substrate.

In the silicon nitride substrate manufacturing method according to the present invention, the oxygen content of the silicon nitride powder is set to 2.0 mass % or less and the water content ratio of the organic solvent is set to 0.03 to 3 mass %. The reasons for the above are as follows. In the silicon nitride powder having the oxygen content of 2.0 mass % or less, the amount of oxygen dissolved in the silicon nitride powder is comparatively small, so that the amount of oxygen in the silicon nitride crystal particle in the obtained silicon nitride substrate is reduced to a lower level, thereby obtaining higher thermal conductivity. Further, the water content ratio of the organic solvent serving as a dispersion medium in which the silicon nitride powder, sintering additive powder, and binder are mixed for producing a slurry is set to 0.03 to 3 mass %, so that the surface of the silicon nitride powder is oxidized at the time of mixing to increase the amount of oxygen in the silicon nitride substrate. Then, silicon oxide formed by oxygen contained in the silicon nitride powder and the generated oxygen at the surface of the silicon nitride powder constitute a liquid phase when the sintering is done together with the sintering additive powder to accelerate sintering of the silicon nitride substrate to thereby obtain a high density and high thermal conductivity silicon nitride substrate. Although a cause for the increase in the amount of oxygen in the silicon nitride powder during the mixing has not yet been clear, the present inventor considers that it is due to oxidation of the surface of the silicon nitride surface accompanied by contact between the surface of the silicon nitride powder and water in the organic solvent. When the water content ratio of the organic solvent exceeds 3 mass %, the amount of the liquid phase generated during the sintering becomes excessive, with result that generated liquid phase remains in the silicon nitride sintered body as a grain boundary phase, adversely affecting the thermal conductivity of the silicon nitride substrate. On the other hand, when the water content ratio of the organic solvent is less than 0.03 mass %, oxidation of the surface of the silicon nitride powder is insufficient, so that a sufficient liquid phase is not generated during the sintering to lower the density and thermal conductivity of the silicon nitride substrate.

Further, the reason that the additive ratio of the sintering additive powder is set to 4 to 15 mol % is as follows (additive ratio=amount of sintering additive powder on molar basis/(amount of silicon nitride powder+amount of sintering additive powder)×100). As described above, the silicon oxide of the silicon nitride powder constitute a liquid phase during the sintering together with the sintering additive powder to accelerate sintering, so that when the additive ratio of the sintering additive powder is less than 4 mol %, the amount of the liquid phase to be generated is insufficient to lower the density and thermal conductivity of the silicon nitride substrate. On the other hand, when the additive ratio of the sintering additive powder exceeds 15 mol %, the amount of the liquid phase to be generated becomes excessive, with result that generated liquid phase remains in the silicon nitride sintered substrate as a grain boundary phase, adversely affecting the thermal conductivity of the silicon nitride substrate.

Examples of the sintering additive powder may include rare-earth element oxide ($RE_2O_3$) of rare-earth element (RE), oxide of alkaline-earth metal, and other metal oxides that constitute a liquid phase together with the silicon oxide of the silicon nitride powder at the sintering time. It is preferable to use yttrium oxide ($Y_2O_3$) and erbium oxide ($Er_2O_3$) as the rare-earth element oxide ($RE_2O_3$) and magnesium oxide (MgO) as the oxide of the alkaline-earth metal.

According to the present invention, there is provided a silicon nitride substrate manufactured by the above silicon nitride substrate manufacturing method. The silicon nitride substrate contains β-type silicon nitride, at least one rare-earth element (RE), and magnesium (Mg). The total content of MgO and $RE_2O_3$ is set to 4 to 15 mol % when the contained magnesium (Mg) and rare-earth element (RE) are converted to magnesium oxide (MgO) and rare-earth element oxide ($RE_2O_3$), respectively. This allows a high density and high thermal conductivity silicon nitride substrate to be manufactured without the occurrence of a molding crack or degreasing crack.

The silicon nitride substrate according to the present invention contains β-type silicon nitride, at least one rare-earth element (RE), and magnesium (Mg), wherein the total content of MgO and $RE_2O_3$ is set to 4 to 15 mol % when the contained magnesium (Mg) and rare-earth element (RE) are converted to magnesium oxide (MgO) and rare-earth element oxide ($RE_2O_3$), respectively. This allows a particularly high density/high conductivity silicon nitride substrate to be obtained. This is because that a liquid phase constituted by MgO and $RE_2O_3$ during the sintering contributes to improvement of the sintering performance and high density of the silicon nitride substrate. The ratio between the MgO and $RE_2O_3$ (MgO/$RE_2O_3$) is preferably 0.1 to 20 in a molar ratio.

According to the present invention, there is provided a silicon nitride circuit board including a metal circuit plate bonded to one surface of the silicon nitride substrate with high density and with high thermal conductivity, and a metal radiator plate bonded to the other surface of the silicon nitride substrate. This allows a silicon nitride circuit board excellent in thermal radiation performance and insulating performance to be achieved.

According to the present invention, there is provided a semiconductor module obtained by mounting a semiconductor device on the silicon nitride circuit board including a metal circuit plate bonded to one surface of the high density and high thermal conductivity silicon nitride substrate and a metal radiator plate bonded to the other surface of the silicon nitride substrate. This allows heat generated from the semiconductor device to effectively be radiated.

BRIEF DESCRIPTION OF THE DRAWINGS

FIG. 1 is a cross-sectional view of a silicon nitride circuit board.

BEST MODE FOR CARRYING OUT THE INVENTION

A preferred embodiment for practicing the present invention will be described blow.

One embodiment of the present invention is a manufacturing method of a silicone nitride substrate as an insulating ceramic substrate used in the abovementioned power semiconductor module, etc. First, as a raw material setting/mixing process, a sintering additive powder is added in an amount of 4 to 15 mol % to a silicon nitride powder as a main raw material having an oxygen amount of 2.0 mass % or less and a specific surface area of 3 to 11 $m^2$/g, followed by addition of binder. Then, these materials are mixed using an organic solvent which serves as a dispersion medium and has a water content ratio of 0.03 to 3 mass % to obtain a slurry.

Although the oxygen content of the silicon nitride powder used is set here to 2 mass % or less, it is preferably 0.4 to 1.2 mass %. When the oxygen content is 0.4 mass % or greater, a sufficient liquid phase is generated during the sintering, allowing a higher-density and higher thermal conductivity silicon nitride substrate in which the sintering performance is improved to be obtained. Further, when the oxygen content falls within 1.2 mass %, the oxygen amount dissolved in the silicon nitride powder becomes further small, with the result that the oxygen amount dissolved in the silicon nitride powder is reduced to a level lower than that of the oxygen amount in the silicon nitride crystal particle in the obtained silicon nitride substrate, thereby obtaining higher thermal conductivity. Further, although the specific surface area of the silicon nitride powder is set to 3 to 11 $m^2$/g, it is preferably 3.5 to 9 $m^2$/g. When the specific surface area falls within the range of 3.5 to 9 $m^2$/g, the molding crack and/or degreasing crack becomes difficult to occur, and a higher-density and higher thermal conductivity silicon nitride substrate can be obtained. For the same reason, the specific surface area of the silicon nitride powder is more preferably 4 to 8 $m^2$/g.

Further, although the additive ratio of the sintering additive powder is set to 4 to 15 mol %, it is preferably 9 to 11 mol % (additive ratio=amount of sintering additive powder on molar basis/(amount of silicon nitride powder+amount of sintering additive powder)×100). The reason is as follows. That is, during the sintering, silicon oxide of the silicon nitride constitutes a liquid phase together with the sintering additive powder and the liquid phase to be generated is optimized, and a higher density silicon nitride sintered body having a high thermal conductivity of 85 W/m·K or more can be obtained.

Examples of the sintering additive powder may include rare-earth element oxide ($RE_2O_3$) of rare-earth element (RE), oxide of alkaline-earth metal, and other metal oxides that constitute a liquid phase together with the silicon oxide of the silicon nitride powder at the sintering time. It is preferable to use yttrium oxide ($Y_2O_3$) as the rare-earth element oxide ($RE_2O_3$) and magnesium oxide (MgO) as the oxide of the alkaline-earth metal in order to obtain a higher strength and higher density silicon nitride substrate. The ratio between the MgO and $RE_2O_3$(MgO/$RE_2O_3$) is preferably 0.1 to 20 in a molar ratio.

Preferred example of the binder used in the silicon nitride substrate manufacturing method according to the present invention include polyvinyl butyral, polybutyl methacrylate, and the like. The polyvinyl butyral is most suitable in terms of prevention of the molding crack and degreasing crack. The additive amount of the binder is 8 to 25 parts by mass relative to total 100 parts by mass of the silicon nitride powder and sintering additive powder. When the additive amount of the binder is less than 8 parts by mass, a defect occurs in a molded article during drying at the molding time, making it easy to cause a molding crack; while when the additive amount of the binder exceeds 25 parts by mass, a crack easily occurs during the degreasing. The additive amount of the binder is more preferably 10 to 20 parts by mass relative to total 100 parts by mass of the silicon nitride powder and sintering additive powder.

Examples of the organic solvent used in the silicon nitride substrate manufacturing method according to the present invention may include an alcohol-based organic solvent, a non-alcohol organic solvent, and a combined solvent thereof. In the silicon nitride substrate manufacturing method according to the present invention, the water content ratio of the organic solvent is set to 0.03 to 3 mass %. As described above, the organic solvent having a water content ratio of 0.03 to 3 mass % may be used, while in the case where a commercially available organic solvent, the water content ratio can be regulated as follows. That is, the amount of water thereof is measured by a known method such as a Karl Fischer electrometric titration method and, based on the measurement result, water is added to the organic solvent such that the water content ratio is 0.03 to 3 mass %. The water content of the organic solvent is more preferably 0.09 to 2 mass %.

The total amount of the organic solvent to be injected is set to a value sufficient for mixing. When the total amount of the organic solvent to be injected is 30 to 100 parts by mass relative to total 100 parts by mass of the silicon nitride powder and sintering additive powder, the silicon nitride powder surface and water in the organic solvent can be brought into contact with each other, thereby increasing the amount of oxygen in the silicon nitride powder in the mixing.

Although the silicon nitride powder, sintering additive powder, and binder are mixed in the organic solvent which is a dispersion medium to produce a slurry in the silicon nitride substrate manufacturing method according to the present invention, an additive agent such as a plasticizer or a dispersant may be added to the above materials.

The plasticizer is added to lower the glass-transition temperature of the binder to facilitate handling of the sheet. Preferred examples of the plasticizer used in the silicon nitride substrate manufacturing method according to the present invention include di(2-ethylhexyl)phthalate, butyl phthalyl butyl glycolate, and the like. The additive amount of the plasticizer is 2 to 30 mass % relative to the raw material powder. When the additive amount is less than 2 mass %, the plasticity of the sheet is reduced, making it easy to cause a crack at the molding time or subsequent handling time; while when the additive amount exceeds 30 mass %, the plasticity of the sheet is excessively increased, making it easy to cause irregularity in thickness or deformation.

The dispersant is added for the purpose of suppressing aggregation of the raw material powder at the mixing time to decrease the viscosity of the slurry. Preferred example of the dispersant used in the silicon nitride substrate manufacturing method according to the present invention include a polyoxyethylene type or fatty acid base non-ionic dispersant, an ionic dispersant such as imine, and a mixture thereof. The additive amount of the dispersant is 0.1 to 1 mass % relative to the raw material powder. When the additive amount is less than 0.1 mass %, effect of suppressing the aggregation is insufficient; while when the additive amount exceeds 1 mass %, re-aggregation easily occurs.

In the silicon nitride substrate manufacturing method according to the present invention, the mixing may be performed using a wet type mixer generally used in the production of a ceramic powder, such as a ball mill or attritor, and the ball mill is more preferable. In particular, it is preferable to use a water-cooling jacket type ball mill to perform the mixing with the slurry temperature at the mixing time set to 10 to 45° C.

The mixing condition is set such that the specific surface area of the powder after the mixing is 12 m$^2$/g or less so as to prevent a molding crack from occurring due to an increase in the specific surface area of the powder (silicon nitride powder and sintering additive powder) after the mixing through pulverization of the raw material powder during the mixing. The specific surface area of the powder after the mixing is preferably 5 to 11.5 m$^2$/g.

Subsequently, as a molding process, the slurry obtained after the mixing is defoamed and then thickened to 3 to 50 Pa·s, followed by molding into a plate-like sheet having a predetermined thickness according to a known doctor blade method or its similar methods. The plate thickness of the sheet-like formed body obtained at this time may arbitrarily be determined depending on the use purpose. For example, the plate thickness may be set to about 0.2 to 1.0 mm. At this time, the organic solvent in the slurry is dried to be removed from the sheet-like formed body, with the result that the amount of the organic solvent remaining in the sheet-like formed body is 2 mass % or less.

Subsequently, as a sintering process, one or more of the sheet-like formed bodies are laminated through a parting agent such as BN and heated in the air or in nitrogen atmosphere at a temperature of 400 to 900° C. to perform degreasing to remove organic components of the binder, plasticizer, and dispersant (surface acting agent), followed by sintering for 2 to 50 h in nitrogen atmosphere of 0.1 to 2 MPa at a temperature of 1600 to 2000° C. to obtain a silicon nitride substrate. Although the silicon nitride substrate after the sintering may be used without any processing, or surface treatment such as heating or blasting may be applied to the silicon nitride substrate.

Next, the silicon nitride substrate according to the present embodiment will be described.

The silicone nitride substrate according to the present embodiment, which is obtained by the above manufacturing method, contains β-type silicon nitride, at least one rare-earth element (RE), and magnesium (Mg). When the contained magnesium (Mg) and rare-earth element (RE) are converted to magnesium oxide (MgO) and rare-earth element oxide ($RE_2O_3$), respectively, the total content of MgO and $RE_2O_3$ is 4 to 15 mol %. In order to obtain higher sintered body density, MgO of 6.0 mol % or more and $RE_2O_3$ of 0.6 mol % or more are preferably contained.

In the silicon nitride substrate according to the present invention, Al of 0.3 mass % or less is preferably contained, in terms of $Al_2O_3$. The thermal conductivity of the silicon nitride substrate is influenced by the amount of contained Al and, when the Al content is 0.3 mass % or less, a thermal conductivity of 80 W/m·K or more can be obtained.

The silicon nitride substrate obtained through the above manufacturing method has high bending strength and high conductivity and can thus be used as: various types of substrate such as a circuit substrate for a high-frequency transistor or a power semiconductor module or a multi-chip module substrate; or a member for electronic parts such as Peltier element thermal conducting plate or heat sink for various types of heating elements. The silicon nitride substrate has less vacancy and high density and has high thermal conductivity, so that when the silicon nitride substrate obtained through the manufacturing method according to the present embodiment is used as a semiconductor device mounting substrate, a substrate excellent in the insulating and thermal radiating properties can be achieved.

Further, by bonding a Cu (copper) circuit plate or Al (aluminum) circuit plate serving as a metal circuit/metal radiator plate to one or both surfaces of the silicon nitride substrate according to the present embodiment using a DBC method (Direct Bonding Copper method) or an active metal brazing material method, a silicon nitride circuit board is obtained. In the DBC method, the silicon nitride substrate and the Cu or Al circuit plate are heated in inert gas or nitride atmosphere at a temperature not less than the eutectic temperature, and the resultant liquid phase of Cu—O or Al—O eutectic compounds is used as an adhesive to directly bond the circuit plate to one or both surface of the silicon nitride substrate through an eutectic compound layer. In the active metal brazing material method, the Cu or Al circuit plate is bonded to one or both surfaces of the silicon nitride substrate by way of a heat and press process in inert gas or vacuum atmosphere through a brazing material layer obtained by mixing or alloying active metal such as titanium (Ti), zirconium (Zr), or hafnium (Hf) with metal such as argentine (Ag) or copper (Cu), which makes low melting point alloy with the active metal. After bonding the circuit plate, the Cu or Al circuit plate on the silicon nitride substrate is etched to form a circuit pattern, and then, an Ni—P plating is performed on the Cu or Al circuit plate having a circuit pattern, and thus a silicon nitride circuit board is obtained. FIG. 1 illustrates a cross-sectional view of the silicon nitride circuit board. A silicon nitride circuit board 10 includes a silicon nitride substrate 1, a metal circuit plate 2 bonded to one surface of the silicon nitride circuit substrate 1, and a metal radiator plate 3 bonded to the other surface of the silicon nitride circuit substrate 1. The silicon nitride substrate 1 has a rectangular shape with vertical and horizontal dimensions of about 10 to 100 mm and a thickness of about 0.2 to 0.8 mm. The thicknesses of the metal circuit plate 2 and metal radiator plate 3 are 0.2 to 1.0 mm. It is preferable to make the metal circuit plate 2 thicker than the metal radiator plate 3 in order to reduce warpage after the bonding.

In addition, it is possible to manufacture a desired semiconductor module by mounting appropriate semiconductor devices on the silicon nitride circuit board.

EXAMPLES

Now, examples of the present invention will be described hereinafter; however, the present invention is not limited to the examples described below.

Based on the abovementioned silicon nitride substrate manufacturing method, the silicon nitride powder, sintering additive powder, binder, dispersant, plasticizer, and organic solvent were blended in a ratio illustrated in Tables 1 and 2, and a water-cooling jacket type ball mill was used under the condition of silicon nitride ball: φ5 mm and ball amount: 20 to 35 vol % to perform mixing under the conditions illustrated in Tables 1 and 2. The oxygen amount and specific surface area of the silicon nitride powder used are illustrated in Tables 1 and 2. The specific surface areas of the MgO, $Y_2O_3$, and $Er_2O_3$ used as the sintering additive powder are 7 $m^2/g$, 15 $m^2/g$, and 15 $m^2/g$, respectively.

The amount of oxygen in the silicon nitride powder was measured using an oxygen analyzer according to an inert gas fusion-thermal conductivity method.

The specific areas of the silicon nitride powder and sintering additive powder were measured by a single-point BET according to a standard JIS-R1626.

As the organic solvent, a commercially-available one was used. The water content ratio of the commercially-available may be regulated to values shown in Tables 1 and 2 by measuring the amount of water by a Karl Fischer electrometric titration method and then adding water to the organic solvent.

Polyvinyl butyral was used as the binder, 18 mass % of which was added with respect to 100 mass % of the silicon nitride powder and sintering additive powder. di(2-ethylhexyl) phthalate was used as the plasticizer, 7 mass % of which was added. Cationic dispersant was used as the dispersant, 0.4 mass % of which was added.

The slurry obtained by the mixing was molded by a doctor blade method, dried and cut to obtain a sheet-like formed body with dimensions of 150 mm×200 mm and a thickness of 0.4 mm. Then, the obtained sheet-like formed bodies (five sheet-like formed bodies) were laminated sandwiching BN between them, subjected to degreasing in the air at a temperature of 500° C., and then subjected to sintering for five hours in nitrogen atmosphere at a temperature of 1900° C. Finally, the BN was removed to obtain a silicon nitride substrate with average dimensions of 120 mm×160 mm and an average thickness of 0.3 mm.

In the middle of the manufacturing process, a part of the slurry was extracted after the completion of the mixing, and the organic solvent, binder, dispersant, and plasticizer were removed. Then, the specific surface area of the powder after the mixing and increase in oxygen in the silicon nitride powder at the mixing time were measured. The specific surface area of the powder after the mixing was measured by a single-point BET method according to a standard JIS-R1626. The specific surface area of the raw material powder after the mixing is influenced by the specific surface areas of the silicon nitride powder and sintering additive powder after the mixing. However, the additive amount of the sintering additive powder is as small as 15 mol % or less, so that the specific surface area of the raw material powder after the mixing is regulated by the specific area of the silicon powder after the mixing. The increase in oxygen in the silicon nitride powder at the mixing time was obtained by measuring the oxygen content of the raw material powder (containing the silicon nitride powder and sintering additive powder) after the mixing and subtracting the measured oxygen content after the mixing from the total oxygen content of the silicon nitride powder and sintering additive powder before the mixing. The increase in oxygen at the mixing time is caused by a reaction caused by contact between water in the organic solvent and surface of the silicon nitride powder, so that it substantially represents an increase in oxygen only at the surface of the silicon nitride powder. The oxygen content was measured using an oxygen analyzer according to an inert gas fusion-thermal conductivity method.

An evaluation concerning a crack during the molding was made after completion of the molding. In the evaluation of the crack, the outer appearance of a molded green sheet was checked, and a sheet in which the ratio of the length of a cracked part relative to the entire length was 3% or less was determined to be "PASS (o)". Further, an evaluation concerning a degreasing crack was made after completion of the degreasing. In the evaluation of the degreasing crack, the outer appearance after the degreasing was checked, and a sheet having no cracked part was determined to be "PASS (o)".

Then, the contents of magnesium oxide (MgO), yttrium oxide ($Y_2O_3$), and erbium oxide ($Er_2O_3$) in the sintered silicon nitride substrate, Al content in the same, sintered body density and thermal conductivity were measured. It was determined whether the density and thermal conductivity of the sintered body fall within preset ranges (sintered body density: 97.5% or more, thermal conductivity: 80 W/m·K or more).

For obtaining the total content of magnesium oxide (MgO), yttrium oxide ($Y_2O_3$), and erbium oxide ($Er_2O_3$), the silicon nitride substrate was fluidized by microwave decomposition and acid dissolution, and an ICP emission analysis method was used to measure the contents of magnesium (Mg), yttrium (Y), and erbium (Er). The measurement results were then converted into magnesium oxide (MgO), yttrium oxide ($Y_2O_3$), and erbium oxide ($Er_2O_3$) to calculate the weight fractions. Further, with assumption that all the residues other than magnesium oxide (MgO), yttrium oxide ($Y_2O_3$), and erbium oxide ($Er_2O_3$) are silicon nitride ($Si_3N_4$), the molar fraction of the total content of magnesium oxide (MgO), yttrium oxide ($Y_2O_3$), and erbium oxide ($Er_2O_3$) was calculated. At the same time, the Al content was measured.

The sintered body density was measured by an underwater substitution method, and the measured result was converted into a relative density.

The thermal conductivity was measured according to a standard JIS-R1611 by cutting out a measurement specimen having a width of 5 mm from the silicon nitride substrate.

As comparative examples, several extra silicon nitride substrates were also manufactured under manufacturing conditions different from the example, and their material properties were similarly measured and determined. The results are illustrated in Tables 3 and 4 (Comparative Examples 1 to 10).

TABLE 1

| | | | | Example 1 | Example 2 | Example 3 | Example 4 |
|---|---|---|---|---|---|---|---|
| Manufacturing condition | Used raw material | Silicon nitride powder | Oxygen content (mass %) | 0.8 | 0.9 | 0.8 | 0.6 |
| | | | Specific surface area ($m^2/g$) | 5.4 | 10 | 5.9 | 3.8 |
| | | Sintering additive powder | Additive Total | 11.0 | 11.0 | 11.0 | 11.0 |
| | | | amount MgO | 9.8 | 9.8 | 9.8 | 9.8 |
| | | | (mol %) $Y_2O_3$ | 1.2 | 1.2 | 1.2 | 1.2 |
| | | | $Er_2O_3$ | 0 | 0 | 0 | 0 |
| | Organic solvent | Type | | Ethanol + n-butanol | | | |
| | | Water content ratio (mass %) | | 0.11 | 0.08 | 0.05 | 0.24 |
| | | Blending ratio (parts by mass) | | 40 | 40 | 40 | 40 |
| | Mixture condition | Temperature (° C.) | | 23 | 23 | 45 | 10 |
| | | Time (h) | | 12 | 8 | 6 | 20 |
| Characteristics after mixture | Specific surface area after mixture ($m^2/g$) | | | 6.5 | 10.5 | 6.5 | 60 |
| | Increase in oxygen in silicon nitride powder at mixture time (mass | | | 0.2 | 0.4 | 0.1 | 0.2 |
| Appearance check | Molding crack | | | o | o | o | o |
| | Degreasing crack | | | o | o | o | o |
| Characteristics of sintered body | Composition | Total content of MgO and $RE_2O_3$ (mol %) | | 11.0 (MgO: 9.8, $Y_2O_3$: 1.2) | 11.0 (MgO: 9.8, $Y_2O_3$: 1.2) | 11.0 (MgO: 9.8, $Y_2O_3$: 1.2) | 11.0 (MgO: 9.8, $Y_2O_3$: 1.2) |
| | | Al content (mass %) | | 0.01 | 0.01 | 0.01 | 0.01 |
| | Material Charcteristics | Density of sintered body (%) | | 98.8 | 98.8 | 98.5 | 98.2 |
| | | Thermal conductivity (W/m · K) | | 92 | 86 | 93 | 95 |

| | | | | Example 5 | Example 6 | Example 7 | Example 8 |
|---|---|---|---|---|---|---|---|
| Manufacturing condition | Used raw material | Silicon nitride powder | Oxygen content (mass %) | 0.8 | 0.8 | 0.8 | 2.0 |
| | | | Specific surface area ($m^2/g$) | 6.8 | 11 | 3.0 | 10 |
| | | Sintering additive powder | Additive Total | 11.0 | 7.3 | 12.8 | 11.0 |
| | | | amount MgO | 9.8 | 6.7 | 9.9 | 9.8 |
| | | | (mol %) $Y_2O_3$ | 1.2 | 0.6 | 2.9 | 1.2 |
| | | | $Er_2O_3$ | 0 | 0 | 0 | 0 |
| | Organic solvent | Type | | Ethanol + n-butanol | | | |
| | | Water content ratio (mass %) | | 1.2 | 3.0 | 0.03 | 1.0 |
| | | Blending ratio (parts by mass) | | 50 | 50 | 90 | 90 |
| | Mixture condition | Temperature (° C.) | | 23 | 23 | 23 | 23 |
| | | Time (h) | | 12 | 10 | 24 | 10 |
| Characteristics after mixture | Specific surface area after mixture ($m^2/g$) | | | 8.2 | 12.0 | 5 | 11.5 |
| | Increase in oxygen in silicon nitride powder at mixture time (mass | | | 0.3 | 0.5 | 0.05 | 0.5 |
| Appearance check | Molding crack | | | o | o | o | o |
| | Degreasing crack | | | o | o | o | o |
| Characteristics of sintered body | Composition | Total content of MgO and $RE_2O_3$ (mol %) | | 11.0 (MgO: 9.8, $Y_2O_3$: 1.2) | 7.3 (MgO: 6.7, $Y_2O_3$: 0.6) | 12.8 (MgO: 9.9, $Y_2O_3$: 2.9) | 11.0 (MgO: 9.8, $Y_2O_3$: 1.2) |
| | | Al content (mass %) | | 0.01 | 0.01 | 0.01 | 0.01 |
| | Material Charcteristics | Density of sintered body (%) | | 98.8 | 99.1 | 97.6 | 98.5 |
| | | Thermal conductivity (W/m · K) | | 85 | 80 | 84 | 81 |

TABLE 2

|  |  |  |  |  | Example 9 | Example 10 | Example 11 | Example 12 | Example 13 |
|---|---|---|---|---|---|---|---|---|---|
| Manufacturing condition | Used raw material | Silicon nitride powder | Oxygen content (mass %) | | 0.4 | 1.2 | 0.8 | 0.8 | 0.8 |
| | | | Specific surface area (m²/g) | | 5.3 | 6.5 | 5.4 | 5.4 | 5.4 |
| | | Sintering additive powder | Additive amount (mol %) | Total | 11.0 | 11.0 | 11.5 | 11.0 | 4.8 |
| | | | | MgO | 9.8 | 9.8 | 6.9 | 9.8 | 3.1 |
| | | | | Y₂O₃ | 1.2 | 1.2 | 2.2 | 0 | 1.7 |
| | | | | Er₂O₃ | 0 | 0 | 2.4 | 1.2 | 0 |
| | Organic solvent | Type | | | Ethanol + n-butanol | | | | |
| | | Water content ratio (mass %) | | | 0.11 | 0.11 | 0.11 | 0.11 | 0.11 |
| | | Blending ratio (parts by mass) | | | 40 | 40 | 40 | 40 | 40 |
| | Mixture condition | Temperature (° C.) | | | 23 | 23 | 23 | 23 | 23 |
| | | Time (h) | | | 12 | 12 | 12 | 12 | 12 |
| Characteristics after mixture | Specific surface area after mixture (m²/g) | | | | 6.3 | 7.0 | 6.8 | 6.5 | 6.3 |
| | Increase in oxygen in silicon nitride powder at mixture time (mass | | | | 0.2 | 0.2 | 0.2 | 0.2 | 0.2 |
| Appearance check | Molding crack | | | | ◯ | ◯ | ◯ | ◯ | ◯ |
| | Degreasing crack | | | | ◯ | ◯ | ◯ | ◯ | ◯ |
| Characteristics of sintered body | Composition | Total content of MgO and RE₂O₃ (mol %) | | | 11.0 (MgO: 9.8, Y₂O₃: 1.2) | 11.0 (MgO: 9.8, Y₂O₃: 1.2) | 11.5 (MgO: 6.9, Y₂O₃: 2.2, Er₂O₃: 2.4) | 11.0 (MgO: 9.8, Y₂O₃: 1.2) | 4.8 (MgO: 3.1, Y₂O₃: 1.7) |
| | | Al content (mass %) | | | 0.01 | 0.01 | 0.01 | 0.01 | 0.01 |
| | Material Charcteristics | Density of sintered body (%) | | | 97.5 | 99.0 | 98.6 | 98.5 | 97.6 |
| | | Thermal conductivity (W/m · K) | | | 84 | 84 | 92 | 89 | 83 |

|  |  |  |  |  | Example 14 | Example 15 | Example 16 |
|---|---|---|---|---|---|---|---|
| Manufacturing condition | Used raw material | Silicon nitride powder | Oxygen content (mass %) | | 0.8 | 0.8 | 0.8 |
| | | | Specific surface area (m²/g) | | 5.4 | 5.4 | 5.4 |
| | | Sintering additive powder | Additive amount (mol %) | Total | 15.0 | 11.0 | 11.0 |
| | | | | MgO | 11.0 | 9.8 | 9.8 |
| | | | | Y₂O₃ | 4.0 | 1.2 | 1.2 |
| | | | | Er₂O₃ | 0 | 0 | 0 |
| | Organic solvent | Type | | | Ethanol + n-butanol | Ethanol + n-butanol | Toluene |
| | | Water content ratio (mass %) | | | 0.11 | 0.10 | 0.11 |
| | | Blending ratio (parts by mass) | | | 40 | 40 | 40 |
| | Mixture condition | Temperature (° C.) | | | 23 | 23 | 23 |
| | | Time (h) | | | 12 | 12 | 12 |
| Characteristics after mixture | Specific surface area after mixture (m²/g) | | | | 6.8 | 6.5 | 7.2 |
| | Increase in oxygen in silicon nitride powder at mixture time (mass | | | | 0.2 | 0.3 | 0.2 |
| Appearance check | Molding crack | | | | ◯ | ◯ | ◯ |
| | Degreasing crack | | | | ◯ | ◯ | ◯ |
| Characteristics of sintered body | Composition | Total content of MgO and RE₂O₃ (mol %) | | | 15.0 (MgO: 11.0, Y₂O₃: 4.0) | 11.0 (MgO: 9.8, Y₂O₃: 1.2) | 11.0 (MgO: 9.8, Y₂O₃: 1.2) |
| | | Al content (mass %) | | | 0.01 | 0.3 | 0.01 |
| | Material Charcteristics | Density of sintered body (%) | | | 99.1 | 98.5 | 98.5 |
| | | Thermal conductivity (W/m · K) | | | 82 | 81 | 82 |

TABLE 3

|  |  |  |  |  | Comparative example 1 | Comparative example 2 | Comparative example 3 | Comparative example 4 | Comparative example 5 |
|---|---|---|---|---|---|---|---|---|---|
| Manufacturing condition | Used raw material | Silicon nitride powder | Oxygen content (mass %) | | 0.8 | 0.8 | 1.4 | 0.7 | 0.6 |
| | | | Specific surface area (m²/g) | | 5.7 | 10 | 13 | 2.5 | 3.7 |
| | | Sintering additive powder | Additive amount (mol %) | Total | 11.0 | 11.0 | 11.0 | 11.0 | 11.0 |
| | | | | MgO | 9.8 | 9.8 | 9.8 | 9.8 | 9.8 |
| | | | | Y₂O₃ | 1.2 | 1.2 | 1.2 | 1.2 | 1.2 |
| | | | | Er₂O₃ | 0 | 0 | 0 | 0 | 0 |
| | Organic solvent | Type | | | Ethanol + n-butanol | | | | |
| | | Water content ratio (mass %) | | | 0.02 | 0.005 | 0.11 | 2 | 7 |
| | | Blending ratio (parts by mass) | | | 40 | 40 | 40 | 40 | 40 |
| | Mixture condition | Temperature (° C.) | | | 23 | 23 | 23 | 23 | 23 |
| | | Time (h) | | | 12 | 12 | 12 | 12 | 12 |
| Characteristics after mixture | Specific surface area after mixture (m²/g) | | | | 6.5 | 10.5 | 14 | 5.0 | 5.5 |
| | Increase in oxygen in silicon nitride powder at mixture time (mass %) | | | | 0.02 | 0.03 | 0.6 | 0.1 | 0.6 |

TABLE 3-continued

|  |  |  | Comparative example 1 | Comparative example 2 | Comparative example 3 | Comparative example 4 | Comparative example 5 |
|---|---|---|---|---|---|---|---|
| Appearance check | Molding crack | | ○ | ○ | x | ○ | ○ |
| | Degreasing crack | | ○ | ○ | ○ | ○ | ○ |
| Characteristics of sintered body | Composition | Total content of MgO and $RE_2O_3$ (mol %) | 11.0 (MgO: 9.8, $Y_2O_3$: 1.2) | 11.0 (MgO: 9.8, $Y_2O_3$: 1.2) | 11.0 (MgO: 9.8, $Y_2O_3$: 1.2) | 11.0 (MgO: 9.8, $Y_2O_3$: 1.2) | 11.0 (MgO: 9.8, $Y_2O_3$: 1.2) |
| | | Al content (mass %) | 0.01 | 0.01 | 0.01 | 0.01 | 0.01 |
| | Matarial Charcteristics | Density of sintered body (%) | 96.7 | 97.0 | 98.5 | 98.4 | 98.5 |
| | | Thermal conductivity (W/m · K) | 85 | 81 | 78 | 74 | 77 |

TABLE 4

|  |  |  |  |  | Comparative example 6 | Comparative example 7 | Comparative example 8 | Comparative example 9 | Comparative example 10 |
|---|---|---|---|---|---|---|---|---|---|
| Manufacturing condition | Used raw material | Silicon nitride powder | Oxygen content (mass %) | | 0.8 | 0.8 | 2.5 | 0.8 | 0.8 |
| | | | Specific surface area ($m^2/g$) | | 5.9 | 6.1 | 5.7 | 5.4 | 5.7 |
| | | Sintering additive powder | Additive amount (mol %) | Total | 3.7 | 15.3 | 11.0 | 11.0 | 11.0 |
| | | | | MgO | 3.4 | 13 | 9.8 | 9.8 | 9.8 |
| | | | | $Y_2O_3$ | 0.3 | 2.3 | 1.2 | 1.2 | 1.2 |
| | | | | $Er_2O_3$ | 0 | 0 | 0 | 0 | 0 |
| | Organic solvent | Type | | | Ethonol + n-butanol | | | | |
| | | Water content ratio (mass %) | | | 0.13 | 0.25 | 0.08 | 0.11 | 0.11 |
| | | Blending ratio (parts by mass) | | | 40 | 40 | 40 | 40 | 40 |
| | Mixture condition | Temperature (° C.) | | | 23 | 23 | 23 | 23 | 23 |
| | | Time (h) | | | 12 | 12 | 12 | 12 | 12 |
| Characteristics after mixture | Specific surface area after mixture ($m^2/g$) | | | | 7.5 | 7.6 | 11.5 | 6.5 | 6.5 |
| | Increase in oxygen in silicon nitride powder at mixture time (mass %) | | | | 0.3 | 0.3 | 0.5 | 0.2 | 0.2 |
| Appearance check | Molding crack | | | | ○ | ○ | ○ | ○ | ○ |
| | Degreasing crack | | | | ○ | ○ | ○ | x | ○ |
| Characteristics of sintered body | Composition | Total content of MgO and $RE_2O_3$ (mol %) | | | 3.7 (MgO: 3.4, $Y_2O_3$: 0.3) | 15.3 (MgO: 13, $Y_2O_3$: 2.3) | 11.0 (MgO: 9.8, $Y_2O_3$: 1.2) | 11.0 (MgO: 9.8, $Y_2O_3$: 1.2) | 11.0 (MgO: 9.8, $Y_2O_3$: 1.2) |
| | | Al content (mass %) | | | 0.01 | 0.01 | 0.01 | 0.01 | 0.5 |
| | Material Charcteristics | Density of sintered body (%) | | | 94.4 | 89.0 | 99.0 | 98.5 | 98.5 |
| | | Thermal conductivity (W/m · K) | | | 72 | 77 | 72 | 89 | 78 |

As illustrated in Tables 1 and 2, when silicone nitride substrates were manufactured under the conditions that the water content ratio of the organic solvent serving as a dispersion medium was 0.03 to 3 mass %, the specific surface area of the silicon nitride powder having an oxygen content of 2.0 mass % or less was 3 to 11 $m^2/g$, and the additive amount of the ceramic powder serving as a sintering additive was 4 to 15 mol %, an increase in oxygen at the surface of the silicon nitride powder at the mixing time fall within a range of 0.05 to 0.5 mass %, whereby silicon nitride substrates having no molding crack or degreasing crack, in which the total content (setting range: 4 to 15 mol %) of MgO and $RE_2O_3$, sintering body density (setting range: 97.5% or more), and thermal conductivity (setting range: 80 W/m·K or more) all fell within corresponding setting ranges were obtained.

On the other hand, as illustrated in Tables 3, when a silicon nitride substrate of a first comparative example was manufactured under the conditions that the water content ratio of the organic solvent was 0.02 mass %, the oxygen content and specific surface area of the silicon nitride powder were 0.8 mass % and 5.7 $m^2/g$, respectively, and the additive amount of the ceramic powder serving as a sintering additive is 11.0 mol %, an increase in oxygen in the raw material powder at the mixing time was as small as 0.02 mass %, and the sintering body density of the manufactured silicon nitride substrate was as low as 96.7%. This is because the water content ratio of the organic solvent is low, suppressing the oxidation of the surface of the silicon nitride powder. Further, a silicon nitride substrate of a second comparative example was manufactured with the following conditions changed from the first comparative example: water content ratio of the organic solvent=0.005 mass % and specific surface area of the silicon nitride powder=10 $m^2/g$. Also in this case, the water content ratio of the organic solvent is low, suppressing the oxidation of the surface of the silicon nitride powder, with the result that the sintered body density of the manufactured silicon nitride substrate was as low as 97.0%.

Further, when a silicon nitride substrate of a third comparative example was manufactured under the conditions that the water content ratio of the organic solvent was 0.11 mass %, the oxygen content and specific surface area of the silicon nitride powder were 1.4 mass % and 13 $m^2/g$, and the additive amount of the ceramic powder serving as a sintering additive is 11.0 mol %, the sintered body density of the manufactured silicon nitride substrate was as high as 98.5%. However, many molding cracks occurred. That is, although the sintering performance is excellent due to large specific surface area of the silicon nitride powder, the amount of the binder is insufficient to make it difficult to perform molding using the doctor blade method. Further, the specific surface area of the silicone nitride powder is large, so that the increase in oxygen at the mixing time is increased and the thermal conductivity is as low as 78 W/m·K.

Further, when a silicon nitride substrate of a fourth comparative example was manufactured under the conditions that the water content ratio of the organic solvent was 2 mass %, the oxygen content and specific surface area of the silicon nitride powder were 0.7 mass % and 2.5 m$^2$/g, and the additive amount of the ceramic powder serving as a sintering additive is 11.0 mol %, the sintered body density of the manufactured silicon nitride substrate was as low as 96.4%. This is because that the specific surface area of the silicon nitride powder is significantly small, so that even when the water content ratio of the organic solvent is made to fall within the above range, the sintering performance is poor.

Further, when a silicon nitride substrate of a fifth comparative example was manufactured under the conditions that the water content ratio of the organic solvent was 7 mass %, the oxygen content and specific surface area of the silicon nitride powder were 0.8 mass % and 3.7 m$^2$/g, and the additive amount of the ceramic powder serving as a sintering additive is 11.0 mol %, the sintered body density of the manufactured silicon nitride substrate was as high as 98.5%. However, the thermal conductivity is as low as 77 W/m·K. That is, the water content ratio of the organic solvent is high, so that the oxidization of the surface of the silicon nitride powder is significantly accelerated to excessively increase the increase in oxygen at the mixing time, resulting in a reduction in the thermal conductivity.

Further, when a silicon nitride substrate of a sixth comparative example was manufactured under the conditions that the water content ratio of the organic solvent was 0.13 mass %, the oxygen content and specific surface area of the silicon nitride powder were 0.8 mass % and 5.9 m$^2$/g, and the additive amount of the ceramic powder serving as a sintering additive is 3.7 mol %, the sintered body density was as low as 94.4%. This is because that the additive amount of the ceramic powder serving as the sintering additive is small, so that even when the oxidation of the surface of the silicon nitride powder is accelerated, sintering is insufficient.

Further, when a silicon nitride substrate of a seventh comparative example was manufactured under the conditions that the water content ratio of the organic solvent was 0.25 mass %, the oxygen content and specific surface area of the silicon nitride powder were 0.8 mass % and 6.1 m$^2$/g, and the additive amount of the ceramic powder serving as a sintering additive is 15.3 mol %, the thermal conductivity was as low as 77 W/m·K. This is because that additive amount of the ceramic powder serving as the sintering additive is large, so that the total content of MgO and Y$_2$O$_3$ in the silicon nitride substrate becomes as excessive as 15.3 mol %, and the grain boundary phase constituting a factor for reducing the thermal conductivity is increased.

Further, when a silicon nitride substrate of an eighth comparative example was manufactured under the conditions that the water content ratio of the organic solvent was 0.25 mass %, the oxygen content and specific surface area of the silicon nitride powder were 2.5 mass % and 5.7 m$^2$/g, and the additive amount of the ceramic powder serving as a sintering additive is 11.0 mol %, the thermal conductivity was as low as 72 W/m·K. This is because that the amount of oxygen dissolved in the silicon nitride powder is large, and, accordingly, the amount of oxygen in the silicon nitride particle in the obtained silicon nitride substrate becomes large, causing a reduction in the thermal conductivity.

Further, when a silicon nitride substrate of a ninth comparative example was manufactured under the conditions that the water content ratio of the organic solvent was 0.11 mass %, the oxygen content and specific surface area of the silicon nitride powder were 0.8 mass %, 5.4 m$^2$/g, the additive amount of the ceramic powder serving as a sintering additive is 11.0 mol %, and the additive amount of the binder was increased, as compared to the other examples, to 35 mass %, a crack occurred in the substrate at the degreasing time. This is because that the amount of the binder contained in the sheet is large, so that a large deformation occurs at the degreasing time.

Further, when a silicon nitride substrate of a tenth comparative example was manufactured, using the silicon nitride powder containing more Al as an impurity than in the other examples, under the conditions that the water content ratio of the organic solvent was 0.11 mass %, the oxygen content and specific surface area of the silicon nitride powder were 0.8 mass % and 5.4 m$^2$/g, and the additive amount of the ceramic powder serving as a sintering additive is 11.0 mol %, the Al content of the manufactured silicon nitride substrate was as high as 0.5 mass % and thermal conductivity was as low as 78 W/m·K. This is because that Al in the silicon nitride powder is dissolved into the nitride particle, casing a reduction in the thermal conductivity.

As described above, within the setting ranges in the manufacturing conditions illustrated in Tables 1 and 2, occurrence of the molding crack is suppressed and sintering performance is improved. Further, in the obtained silicon nitride substrate, the oxygen content and total content of MgO and RE$_2$O$_3$ fall within the setting ranges illustrated in Tables 1 and 2, so that high density and high thermal conductivity can be achieved.

INDUSTRIAL APPLICABILITY

The present invention provides a silicon nitride substrate manufacturing method with which a high thermal conductivity silicon nitride substrate having excellent sintering performance can be manufactured without the occurrence of a molding crack or degreasing crack, as well as to provide a silicon nitride substrate, and a silicon nitride circuit board and a semiconductor module using the silicon nitride substrate. The present invention can suitably be applied to an insulating substrate of a power semiconductor module capable of high-voltage, large-current operation used in the field of an electric vehicle inverter, etc., or its manufacturing method.

EXPLANATION OF REFERENCE SYMBOLS

1: Silicon nitride substrate
2: Metal circuit plate
3: Metal radiator plate
10: Silicon nitride circuit board

The invention claimed is:

1. A silicon nitride substrate manufacturing method in which a slurry is produced by mixing a silicon nitride powder, a sintering additive powder, a binder, and a dispersant in an organic solvent which is a dispersion medium in a raw material setting/mixing process, and the slurry is formed into a sheet, followed by degreasing and sintering, characterized in that an Al concentration in the silicon nitride substrate is 0.3 mass % or less in terms of Al$_2$O$_3$, the oxygen content of the silicon nitride powder is 2.0 mass % or less and the specific surface area of the silicon nitride powder is 3 to 11 m$^2$/g, the additive ratio of the sintering additive powder is 4 to 15 mol %, the additive amount of the binder is 8 to 25 parts by mass relative to a total 100 parts by mass of the silicon nitride powder and sintering additive powder, and the water content ratio of the organic solvent is 0.03 to 3 mass %, and the additive amount of the dispersant composed of cationic dispersant is 0.1 to 1 mass % relative to the raw material powder, and the slurry is produced by mixing the silicon nitride powder, the sintering additive powder, the binder, and the dispersant in the organic solvent at a temperature of 10 to 45° C. in the raw material setting/mixing process, so that an oxygen increase from the silicon nitride powder before the mixing as compared to the silicon nitride powder after the mixing is in a range of 0.05 to 0.5 mass %, and a specific surface area of the silicon nitride powder after the mixing is 5 to 12 m$^2$/g.

2. A silicon nitride substrate manufactured by the silicon nitride substrate manufacturing method as claimed in claim 1, characterized by comprising β-type silicon nitride, at least one rare-earth element (RE), and magnesium (Mg), the total content of MgO and RE$_2$O$_3$ being 4 to 15 mol % when the contained magnesium (Mg) and rare-earth element (RE) are converted to magnesium oxide (MgO) and rare-earth element oxide (RE$_2$O$_3$), respectively.

3. The silicon nitride substrate manufacturing method according to claim 1, wherein a total amount of the organic solvent is 30 to 100 parts by mass relative to a total 100 parts by mass of the silicon nitride powder and sintering additive powder in the raw material setting/mixing process.

4. The silicon nitride substrate manufacturing method according to claim 1, wherein the oxygen content of the silicon nitride powder is 0.8 to 2.0 mass %, the specific surface area of the same is 5.4 to 11 m$^2$/g, the additive ratio of the sintering additive powder is 7.3 to 15.0 mol %, and the water content ratio of the organic solvent is 0.05 to 3 mass %, the silicon nitride powder, the sintering additive powder, the binder, and the dispersant are mixed in the organic solvent at a temperature of 23 to 45° C., so that a specific surface area of the silicon nitride powder after the mixing is 6.5 to 12 m$^2$/g, in the raw material setting/mixing process.

5. The silicon nitride substrate manufacturing method according to claim 4, wherein a total amount of the organic solvent is 40 to 90 parts by mass relative to a total 100 parts by mass of the silicon nitride powder and the sintering additive powder in the raw material setting/mixing process.

6. The silicon nitride substrate manufacturing method according to claim 5, wherein the oxygen increase from the silicon nitride powder before the mixing as compared to the silicon nitride powder after the mixing is in a range of 0.1 to 0.5 mass %.

7. The silicon nitride substrate manufacturing method according to claim 1, wherein a plasticizer composed of di(2-ethylhexyl)phthalate is added to the slurry, a ball mill is used in the raw material setting/mixing process with ball amount of 20 to 35 vol %, and a molding process to defoam and thicken the slurry so that viscosity of the slurry becomes 3 to 50 Pa·s, is performed after the raw material setting/mixing process.

* * * * *